United States Patent
Hegde et al.

(10) Patent No.: US 11,784,025 B1
(45) Date of Patent: Oct. 10, 2023

(54) INTEGRAL SWEEP IN ION BEAM SYSTEM

(71) Applicant: Plasma-Therm NES LLC, St. Petersburg, FL (US)

(72) Inventors: Sarpangala Hariharakeshava Hegde, Fremont, CA (US); Armin Baur, Largo, FL (US); Wei-Hua Hsiao, St. Petersburg, FL (US)

(73) Assignee: PLASMA-THERM NES LLC, St. Petersburg, FL (US)

( * ) Notice: Subject to any disclaimer, the term of this patent is extended or adjusted under 35 U.S.C. 154(b) by 0 days.

(21) Appl. No.: 17/740,733

(22) Filed: May 10, 2022

(51) Int. Cl.
*H01J 37/08* (2006.01)
*H01J 37/305* (2006.01)

(52) U.S. Cl.
CPC .......... *H01J 37/3056* (2013.01); *H01J 37/08* (2013.01); *H01J 2237/20214* (2013.01)

(58) Field of Classification Search
CPC ........ H01J 37/08; H01J 37/20; H01J 37/3005; H01J 37/3056; H01J 2237/201; H01J 2237/202; H01J 2237/20207; H01J 2237/20214; H01J 2237/20221; H01J 2237/20242
See application file for complete search history.

(56) References Cited

U.S. PATENT DOCUMENTS

| | | | | |
|---|---|---|---|---|
| 6,072,184 A | * | 6/2000 | Okino | H01J 37/3045 250/492.2 |
| 7,474,419 B2 | | 1/2009 | Tappel et al. | |
| 2012/0235036 A1 | * | 9/2012 | Hatakeyama | H01J 37/20 250/310 |
| 2013/0180843 A1 | | 7/2013 | Boguslavsky et al. | |
| 2013/0328246 A1 | | 12/2013 | Wells et al. | |

* cited by examiner

*Primary Examiner* — David E Smith
*Assistant Examiner* — Hsien C Tsai
(74) *Attorney, Agent, or Firm* — Harvey S. Kauget; Burr & Forman LLP

(57) ABSTRACT

The present disclosure provides a method of achieving an integral number of sweeps within an ion beam. A substrate having a fiducial is placed on a wafer stage within the ion beam system. An energetic particle beam is generated within the ion beam system. The substrate is exposed to the energetic particle beam while the wafer stage with the substrate is rotated clockwise so that the fiducial of the substrate travels a sweep distance in a clockwise direction at a first speed and the fiducial of the substrate travels the same sweep distance in a counterclockwise direction at a second speed. The exposure of the substrate to the energetic particle beam is discontinued when the number of complete/full sweeps in the clockwise direction equals the number of complete/full sweeps in the counterclockwise direction.

20 Claims, No Drawings

INTEGRAL SWEEP IN ION BEAM SYSTEM

TECHNICAL FIELD

The present disclosure relates to the field of charged particle sources including plasma sources for direct etching and deposition, broad-beam ion sources for ion beam deposition and etching, and electron sources for surface modification.

BACKGROUND

A typical ion beam etching system has a substrate arranged on a wafer stage that is irradiated with positive ions in an ion beam from an ion source wherein the positive ions etch the substrate. An ion beam etching system includes an ion source that extracts positive ions from a plasma using an extraction electrode. The wafer stage is at a position where the substrate faces the ion beam from the ion source under vacuum. In general, the ion beam etching system also includes an electron source (neutralizer) which emits electrons to neutralize space charge arising from the positive ions extracted from the ion source.

A typical ion beam sputter deposition system has an ion neutral source direct an ion beam onto a sputtering target that results in an energetic particle beam of sputtered material. A substrate is placed onto a wafer stage and the substrate is irradiated with the sputtered material from the sputtering target that deposits onto the substrate.

A typical substrate has a fiducial that is usually a notch at a predetermined location on the edge of the substrate. This fiducial, which may take other forms such as a flat spot on the edge of the substrate, allows for the aligning of the substrate in a desired orientation as the substrate is moved to various processing stations. In addition, a typical substrate can include many devices and may be covered with photoresist masks or other type of masks. The devices can be processed with ion beam exposure to etch the desired shape of the devices on the substrate or, sputtered material from a target can be deposited onto the substrate and devices thereon.

Sweep motion ion milling is a process where the fiducial (wafer notch) on the substrate travels along an arc while the substrate is being exposed to an ion beam. Specifically, in the ion beam etch process, the substrate runs through a partial rotation called a sweep wherein the fiducial on the substrate travels an equal distance in the clockwise and counterclockwise direction during the exposure of the substrate to the ion beam in the ion etch process. In order to achieve symmetrical etching of a three-dimensional structure on the substrate, there must be a full and complete sweep, i.e. integral number of sweeps to assure symmetrical etching of all sides of the three-dimensional structures.

Sweep motion ion deposition is a process where the fiducial (wafer notch) on the substrate travels along an arc while the substrate is being exposed to an energetic particle beam of sputtered material. Specifically, in the ion beam deposition process, the substrate runs through a partial rotation called a sweep wherein the fiducial on the substrate travels an equal distance in the clockwise and counterclockwise direction during the exposure of the substrate to the energetic particle beam of sputtered material in the ion deposition process. In order to achieve symmetrical deposition on a three-dimensional structure on the substrate, there must be a full and complete sweep, i.e. integral number of sweeps to assure symmetrical deposition on all sides of the three-dimensional structures.

When the ion beam etch process or the ion deposition process is time based, the respective process may be terminated with a non-integral number of sweeps since the process is terminated based on time. Most often, this time based termination results in asymmetry of three-dimensional structures on the substrate since the substrate does not travel an equal distance in the clockwise and counterclockwise direction during the exposure of the substrate to the energetic particle beam of the respective process.

Thus, there is a need for a process that results in an integral number of sweeps in an ion beam etch process to assure symmetrical etching of all sides of three-dimensional structures. In addition, there is a need for a process that results in an integral number of sweeps in an ion beam deposition process to assure symmetrical deposition on all sides of three-dimensional structures.

SUMMARY OF THE INVENTION

The present invention provides a novel method to achieve an integral number of sweeps in an ion beam etch process to assure symmetrical etching of all sides of three-dimensional structures. In addition, the present invention provides a novel method to achieve an integral number of sweeps in an ion beam deposition process to assure symmetrical deposition on all sides of three-dimensional structures.

According to one aspect of an embodiment of the present disclosure, a method for etching a substrate within an ion beam etching system comprising the steps of: providing the substrate having a fiducial; generating an ion beam within the etching system; rotating the substrate clockwise so that the fiducial of the substrate travels a sweep distance in a clockwise direction at a first speed while exposing the substrate to the generated ion beam; rotating the substrate counterclockwise so that the fiducial of the substrate travels said sweep distance in a counterclockwise direction at a second speed while exposing the substrate to the generated ion beam; and discontinuing the exposure of the substrate to the generated ion beam when number of sweeps in the clockwise direction equals number of sweeps in the counterclockwise direction.)

According to another aspect of an embodiment of the present disclosure, a method for depositing a thin film on a substrate within an ion beam deposition system comprising the steps of: providing the substrate having a fiducial; generating an ion beam within the ion beam deposition system; exposing a target to the generated ion beam thereby sputtering target material from said target; rotating the substrate clockwise so that the fiducial of the substrate travels a sweep distance in a clockwise direction at a first speed while exposing the substrate to the sputtered target material from said target; rotating the substrate counterclockwise so that the fiducial of the substrate travels said sweep distance in a counterclockwise direction at a second speed while exposing the substrate to the sputtered target material from said target; and discontinuing the exposure of the substrate to the sputtered target material from said target when number of sweeps in the clockwise direction equals number of sweeps in the counterclockwise direction.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

DETAILED DESCRIPTION

In one embodiment according to the present invention, an integral number of sweeps within an ion beam etching system is achieved using a method of processing a substrate having a fiducial wherein the substrate is placed on a wafer stage within the ion beam etching system. The substrate has a top surface that has at least one three-dimensional structure. An energetic particle beam is generated within the ion beam etching system. The at least one three-dimensional structure on the top surface of the substrate is exposed to the energetic particle beam while the wafer stage with the substrate is rotated clockwise so that the fiducial of the substrate travels a sweep distance in a clockwise direction at a first speed and the at least one three-dimensional structure on the top surface of the substrate continues to be exposed to the energetic particle beam while the wafer stage with the substrate is rotated counterclockwise so that the fiducial of the substrate travels the same sweep distance in a counterclockwise direction at a second speed. The exposure of the at least one three-dimensional structure on the top surface of the substrate to the generated ion beam is discontinued when the number of complete/full sweeps in the clockwise direction equals the number of complete/full sweeps in the counterclockwise direction.

In one embodiment according to the present invention, an integral number of sweeps within an ion beam deposition system is achieved using a method of processing a substrate having a fiducial wherein the substrate is placed on a wafer stage within the ion beam deposition system. The substrate has a top surface that has at least one three-dimensional structure. An energetic particle beam is generated within the ion beam deposition system. A target is exposed to the generated ion beam thereby sputtering target material from the target. The at least one three-dimensional structure on the top surface of the substrate is exposed to the sputtered target material while the wafer stage with the substrate is rotated clockwise so that the fiducial of the substrate travels a sweep distance in a clockwise direction at a first speed and the at least one three-dimensional structure on the top surface of the substrate continues to be exposed to the sputtered target material while the wafer stage with the substrate is rotated counterclockwise so that the fiducial of the substrate travels the same sweep distance in a counterclockwise direction at a second speed. The exposure of the at least one three-dimensional structure on the top surface of the substrate to the sputtered target material is discontinued when the number of complete/full sweeps in the clockwise direction equals the number of complete/full sweeps in the counterclockwise direction.

In any embodiment of the present invention, a process variable can be adjusted so that the number of sweeps in the clockwise direction equals the number of sweeps in the counterclockwise direction.

In any embodiment of the present invention, the first speed can be adjusted so that the number of sweeps in the clockwise direction equals the number of sweeps in the counterclockwise direction.

Sweep speed can be determined in several ways, including, but not limited to interpolating from experimental data or a predictive calculation using an algorithm.

In any embodiment of the present invention, the second speed can be adjusted so that the number of sweeps in the clockwise direction equals the number of sweeps in the counterclockwise direction.

In any embodiment of the present invention, a beam power can be adjusted so that the number of sweeps in the clockwise direction equals the number of sweeps in the counterclockwise direction.

In any embodiment of the present invention, the substrate can be dwelled for a first dwell time at an end of the sweep in the clockwise direction.)

In any embodiment of the present invention, the first dwell time can be adjusted so that the number of sweeps in the clockwise direction equals the number of sweeps in the counterclockwise direction.

In any embodiment of the present invention, the substrate can be dwelled a second dwell time at an end of the sweep in the counterclockwise direction.

In any embodiment of the present invention, the second dwell time can be adjusted so that the number of sweeps in the clockwise direction equals the number of sweeps in the counterclockwise direction.

In any embodiment of the present invention, the total etch depth needed can be executed through a predictive calculation of the sweep speed needed to result in an integral number of sweeps.

In any embodiment of the present invention, the total etch depth needed can be executed through an empirical estimation of the sweep speed needed to result in an integral number of sweeps.

In any embodiment of the present invention, may include wafer stage tilt with respect to the direction of the ion beam.

In any embodiment of the present invention, there may be a combination of varying the sweep speed and the ion beam current so that the total dosage is maintained while completing the integral number of sweep motions.

In any embodiment of the present invention, the total deposition thickness needed can be executed through a predictive calculation of the sweep speed needed to result in an integral number of sweeps.

In any embodiment of the present invention, the total deposition thickness needed can be executed through an empirical estimation of the sweep speed needed to result in an integral number of sweeps.

In any embodiment of the present invention, may include wafer stage tilt with respect to the direction of the deposition target.)

In any embodiment of the present invention, there may be a combination of varying the sweep speed and the ion beam deposition current so that the total dosage is maintained while completing the integral number of sweep motions.

In any embodiment of the present invention, the stage that holds the substrate can tilt the substrate with respect to the energetic particle beam. Provisions may be made on the wafer stage to cool the substrate during the exposure to the energetic particle beam. The substrate may also be heated to a specific temperature to enhance the ion beam deposition process.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further, and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

What is claimed is:

1. A method for etching a substrate within an ion beam etching system comprising the steps of:
   providing the substrate having a fiducial;
   generating an ion beam within the etching system;
   rotating the substrate clockwise so that the fiducial of the substrate travels a sweep distance in a clockwise direction at a first speed while exposing the substrate to the generated ion beam;
   rotating the substrate counterclockwise so that the fiducial of the substrate travels said sweep distance in a counterclockwise direction at a second speed while exposing the substrate to the generated ion beam; and
   discontinuing the exposure of the substrate to the generated ion beam when number of sweeps in the clockwise direction equals number of sweeps in the counterclockwise direction.

2. The method of claim 1 wherein the substrate further comprising a three dimensional structure.

3. The method of claim 1 further comprising adjusting a process variable so that the number of sweeps in the clockwise direction equals the number of sweeps in the counterclockwise direction.

4. The method of claim 1 further comprising adjusting the first speed so that the number of sweeps in the clockwise direction equals the number of sweeps in the counterclockwise direction.

5. The method of claim 4 further comprising adjusting the second speed so that the number of sweeps in the clockwise direction equals the number of sweeps in the counterclockwise direction.

6. The method of claim 1 further comprising adjusting a beam power so that the number of sweeps in the clockwise direction equals the number of sweeps in the counterclockwise direction.

7. The method of claim 1 further comprising dwelling the substrate a first dwell time at an end of the sweep in the clockwise direction.

8. The method of claim 1 further comprising adjusting the first dwell time so that the number of sweeps in the clockwise direction equals the number of sweeps in the counterclockwise direction.

9. The method of claim 8 further comprising dwelling the substrate a second dwell time at an end of the sweep in the counterclockwise direction.

10. The method of claim 9 further comprising adjusting the second dwell time so that the number of sweeps in the clockwise direction equals the number of sweeps in the counterclockwise direction.

11. A method for depositing a thin film on a substrate within an ion beam deposition system comprising the steps of:
    providing the substrate having a fiducial;
    generating an ion beam within the ion beam deposition system;
    exposing a target to the generated ion beam thereby sputtering target material from said target;
    rotating the substrate clockwise so that the fiducial of the substrate travels a sweep distance in a clockwise direction at a first speed while exposing the substrate to the sputtered target material from said target;
    rotating the substrate counterclockwise so that the fiducial of the substrate travels said sweep distance in a counterclockwise direction at a second speed while exposing the substrate to the sputtered target material from said target; and
    discontinuing the exposure of the substrate to the sputtered target material from said target when number of sweeps in the clockwise direction equals number of sweeps in the counterclockwise direction.

12. The method of claim 11 wherein the substrate further comprising a three dimensional structure.

13. The method of claim 11 further comprising adjusting a process variable so that the number of sweeps in the clockwise direction equals the number of sweeps in the counterclockwise direction.

14. The method of claim 11 further comprising adjusting the first speed so that the number of sweeps in the clockwise direction equals the number of sweeps in the counterclockwise direction.

15. The method of claim 14 further comprising adjusting the second speed so that the number of sweeps in the clockwise direction equals the number of sweeps in the counterclockwise direction.

16. The method of claim 11 further comprising adjusting a beam power so that the number of sweeps in the clockwise direction equals the number of sweeps in the counterclockwise direction.

17. The method of claim 11 further comprising dwelling the substrate a first dwell time at an end of the sweep in the clockwise direction.

18. The method of claim 11 further comprising adjusting the first dwell time so that the number of sweeps in the clockwise direction equals the number of sweeps in the counterclockwise direction.

19. The method of claim 18 further comprising dwelling the substrate a second dwell time at an end of the sweep in the counterclockwise direction.

20. The method of claim 19 further comprising adjusting the second dwell time so that the number of sweeps in the clockwise direction equals the number of sweeps in the counterclockwise direction.

* * * * *